(12) United States Patent
Kato et al.

(10) Patent No.: US 6,399,968 B2
(45) Date of Patent: Jun. 4, 2002

(54) SEMICONDUCTOR PHOTORECEIVING DEVICE

(75) Inventors: Masanobu Kato; Ryozo Furukawa, both of Tokyo (JP)

(73) Assignee: Oki Electric Industry Co., Ltd., Tokyo ( * ) Notice: Subject to any disclaimer, the term of this patent is extended or adjusted under 35 U.S.C. 154(b) by 0 days.

(21) Appl. No.: 09/732,728

(22) Filed: Dec. 11, 2000

(30) Foreign Application Priority Data

Jul. 13, 2000 (JP) ........................................ 2000-212945

(51) Int. Cl.$^7$ ..................... H01L 31/072; H01L 31/109; H01L 31/0328; H01L 31/0336
(52) U.S. Cl. .......................... 257/184; 257/21; 257/22; 257/28
(58) Field of Search .............................. 257/21, 22, 28, 257/184

(56) References Cited

U.S. PATENT DOCUMENTS

| 5,017,986 A | | 5/1991 | Rouse |
| 5,485,021 A | | 1/1996 | Abe |
| 6,069,367 A | * | 5/2000 | Tomiya et al. ................. 257/22 |
| 6,300,650 B1 | * | 10/2001 | Sato ........................... 257/184 |

FOREIGN PATENT DOCUMENTS

JP    2000-77702    3/2000

OTHER PUBLICATIONS

"Automatic Machine for Bonding Fiber Block to Planar Lightwave Circuit", Ishigami et al., 1998 Institute of Electronics, Information and Communication Engineers, Electronics Society Conference C–3–87.

"1.3/1.55 $\mu$m WDM optical module for full duplex operation using PLC platform", Hashimoto et al., 1998 Institute of Electronics, Information and Communication Engineers, Electronics Society Conference C–3–110.

"WDM by multilayered dielectric filter on silica based waveguide (3)", Maeda et al., 1998 Institute of Electronics, Information and Communication Engineers, Electronics Society Conference C–3–150.

"Applied Physics and Optics Selection 3, Thin Films", Yoshida, Baifukan, 1997, pp. 173–174.

* cited by examiner

Primary Examiner—Ngân V. Ngô
(74) Attorney, Agent, or Firm—Wenderoth, Lind & Ponak, L.L.P.

(57) ABSTRACT

The present invention provides a photoreceiving device that is inexpensive and has good properties as a photoreceiving device for selectively receiving long wavelength light. This is a semiconductor photoreceiving device 10 for selectively receiving long wavelength light from multiplexed light including long wavelength light A and short wavelength light B. This photoreceiving device comprises a multilayered film 22 comprising alternately stacked layers of materials having mutually different indexes of refraction and the thicknesses and number of which are designed so as to transmit said long wavelength light and reflect said short wavelength light; and a first light-absorbing layer 14 composed of a material having a band gap wavelength longer than the wavelength of said long wavelength light.

20 Claims, 7 Drawing Sheets

TRANSMITTANCE PROPERTIES OF MULTILAYERED FILM

SEMICONDUCTOR PHOTORECEIVING DEVICE

BACKGROUND OF THE INVENTION

1. Field of the Invention

The present invention relates to a semiconductor photoreceiving device that is suitable for use in optical communications and performs opto-electric conversion of light at high speeds, and more particularly to a semiconductor photoreceiving device that can selectively extract a signal of long wavelength light in multiplexed optical communications (especially with two wavelengths).

This application is a counterpart application of Japanese application Serial Number 212945/2000, filed Jul. 13, 2000, the subject matter of which is incorporated herein by reference.

2. Description of Related Art

In general, light of wavelengths 1.3 μm and 1.55 μm is used as the optical signal in optical communications, especially flat mounted optical modules. In optical integrated circuits, this 1.3 μm and 1.55 μm optical signal is present as multiplexed light. Accordingly, it is necessary that the photoreceiving device be an element that can selectively receive both 1.3 μm optical signals and 1.55 μm optical signals.

Conventionally, the photoreceiving devices that selectively receive optical signals with wavelengths of 1.3 μm (hereinafter referred to as short wavelength) are provided with a light-absorbing layer composed of InGaAsP with a band gap wavelength of about 1.4 μm. However, the light-absorbing layer generally has the property of absorbing light with wavelengths shorter than the band gap wavelength of the light-absorbing layer. Accordingly, it is very difficult to form a light-absorbing layer that can receive only an optical signal of 1.55 μm (hereinafter referred to as long wavelength) in a single layer.

Consequently, the method of interposing an optical filter between the multiplexed light entering the photoreceiving device and the photoreceiving surface of the photoreceiving device has been used for the selective reception of long wavelength optical signals, as disclosed in the Reference 1 (Ishigami et al., "Automatic Machine For Bonding Fiber Block To Planar Lightwave Circuit", 1998 Institute of Electronics, Information and Communication Engineers, Electronics Society Conference C-3-87), Reference 2 (Hashimoto et al., "1.3/1.55 μm WDM optical module for full duplex operation using PLC platform", 1998 Institute of Electronics, Information and Communication Engineers, Electronics Society Conference C-3-110), and Reference 3 (Maeda et al., "WDM by multilayered dielectric filter on silica based waveguide (3)", 1998 Institute of Electronics, Information and Communication Engineers, Electronics Society Conference C-3-150).

As another method for the selective reception of long wavelength optical signals, the inventors of the present invention previously proposed a semiconductor photoreceiving device disclosed in Reference 4 (Japanese Unexamined Patent Pubication No. 2000-77702). The semiconductor photoreceiving device in Reference 4 comprises a first light-absorbing layer and a second light-absorbing layer in that order within an optical path for multiplexed light; wherein this first light-absorbing layer is composed of a material with a band gap wavelength longer than 1.3 μm and shorter than 1.55 μm (for example, InGaAsP), and the second light-absorbing layer is composed of a material having a band gap wavelength longer than 1.55 μm (for example, InGaAs). Shorter wavelength light is thereby absorbed by the first light-absorbing layer and long wavelength light that passes through this first light-absorbing layer is absorbed by the second light-absorbing layer.

However, in the case of using an optical filter with the object of selectively receiving long wavelength light, it becomes necessary to perform a process of making a recess on the waveguide of the optical integrated circuit (PLC: planar lightwave circuit) in order to insert the optical filter. This results in a high insertion loss for the optical waveguide, increases PLC processing costs, and results in relatively high part costs for the optical filter.

In a photoreceiving device comprising a first light-absorbing layer and a second light-absorbing layer, the first light-absorbing layer must be thick so that the selection ratio of short wavelength light to long wavelength light is the desirable selection ratio for the photoreceiving device. As a result, there is high stress between the first light-absorbing layer and the layers formed on top of the first light-absorbing layer, and there is a risk of strain occurring in each layer formed on top of the first light-absorbing layer. Also, the first light-absorbing layer is formed by epitaxial growth; the cost of the photoreceiving device increases in proportion to the thickness of the epitaxial layer.

SUMMARY OF THE INVENTION

It is an object of the present invention to provide a photoreceiving device used in multiplexed optical communications including short wavelength light and long wavelength light for selectively receiving long wavelength light, that is inexpensive and has good properties, without cutting away the PLC waveguide and inserting an optical filter.

In order to achieve this object, the present invention is to provide a semiconductor photoreceiving device having the following constitution for selectively receiving long wavelength light from multiplexed light including long wavelength light and short wavelength light. Specifically, this semiconductor photoreceiving device comprises a multilayered film of alternately stacked layers of materials having mutually different indexes of refraction. The thickness of each layer and the number of layers in the multilayered film are designed such that long wavelength light is transmitted and short wavelength light is reflected by the multilayered film. The photoreceiving device further comprises a first light-absorbing layer that is composed of a material having a band gap wavelength longer than the long wavelength light. Also, the photoreceiving device has a structure such that multiplexed light enters the first light-absorbing layer through the multilayered film.

When multiplexed light comprising long wavelength light and short wavelength light enters this multilayered film, the short wavelength light is reflected by the multilayered film and the long wavelength light passes through the multilayered film and reaches the light-absorbing layer. The long wavelength light can thereby be selectively absorbed, or received, by the light-absorbing layer. Therefore, it is unnecessary to insert a conventional optical filter requiring a cutting operation, between the photoreceiving device and the incoming multiplexed light. Consequently, problems arising from establishing the optical filter (PLC processing costs, optical filter costs, optical waveguide insertion loss) are avoided.

This type of semiconductor photoreceiving device preferably comprises a substrate having a first main surface and a second main surface; the first light-absorbing layer may be established on the first main surface side of the substrate and the multilayered film may be established on the second main surface side of the substrate.

When the photoreceiving surface for the multiplexed light is assumed to be the second main surface side of the substrate, and the first main surface of the substrate is referred to as the top surface, while the second main surface is referred to as the back surface, the semiconductor photoreceiving device having this type of constitution is referred to as a back surface incidence (or entry) type photoreceiving device.

The semiconductor photoreceiving device may also be constituted such that the substrate has a first main surface and the multilayered film is established on the first main surface side of the substrate with the first light-absorbing layer interposed therebetween.

A photoreceiving device with such a constitution is referred to as a top surface incidence (or entry) type photoreceiving device in contrast to the abovementioned back surface incidence type photoreceiving device.

In these back surface incidence type and top surface incidence type photoreceiving devices, multiplexed light including long wavelength light and short wavelength light first enters the multilayered film and then the short wavelength light is reflected by this multilayered film. After that, the long wavelength light passes through the multilayered film, passes through the substrate, reaches the first light-absorbing layer, and is absorbed (received) by this first light-absorbing layer.

The top surface incidence type and back surface incidence type photoreceiving devices are suitable for use in the case of incident light spread over a broad range, such as in monitor photodiodes (MPD), for example, because the photoreceiving surface can be made as large as the chip size.

The constitution of the semiconductor photoreceiving device is preferably provided a substrate having a first main surface and a side surface. The first light-absorbing layer may be established on the first main surface side of the substrate and the multilayered film may be established on the side surface of the substrate. Furthermore, a mesa surface is preferably established on the substrate so that light passing through the multilayered film is reflected towards the first light-absorbing layer.

A photoreceiving device with such a constitution is called the end surface incidence (or entry) type. The end surface incidence type device is able to operate at higher speeds than the top surface or back surface incidence type devices. Because a mesa surface is established on the substrate, light passing through the multilayered film and entering (or impinging on or arriving at) the substrate is reflected by the mesa surface and this reflected light enters the second light-absorbing layer from the first main surface of the substrate. The short wavelength light in the multiplexed light is thereby reflected by the multilayered film. After this, only the long wavelength light is absorbed by the first light-absorbing layer.

The semiconductor photoreceiving devices according to the present invention may also be provided with a substrate having a first main surface, and may be constituted so that the first light-absorbing layer is established on this first main surface side and the multilayered film is disposed so that the light passing through the multilayered film is refracted and is incident on or enters the first light-absorbing layer. This type of constitution can be given as a variation of the end surface incidence type discussed above. A V-shaped groove is formed in the second main surface of the substrate by wet etching and an end surface comprising the mesa surface of the V-shaped groove is formed by cleavage or the like (for example, scribing, dicing, etching) near the peak of this V-shaped groove. This end surface becomes the photoreceiving surface and the multilayered film is established thereon. The short wavelength light in the multiplexed light entering the multilayered film is thereby reflected by the multilayered film. The light passing through the multilayered film is refracted by the end surface and passes through the substrate to reach the first light-absorbing layer. After this, the long wavelength light is absorbed by the first light-absorbing layer.

A semiconductor photoreceiving device having the constitution discussed above preferably further comprises a second light-absorbing layer for selectively absorbing short wavelength light from the multiplexed light. This second light-absorbing layer may be established at a position such that the light passing through the multilayered film enters the first light-absorbing layer through the second light-absorbing layer.

The second light-absorbing layer is preferably composed of a material having a band gap wavelength longer than the short wavelength light and shorter than the long wavelength light.

It is necessary to increase the thickness of the multilayered film in order to have a selection ratio of short wavelength light to long wavelength light of about −30 dB, For example, in order to further improve the properties of the photoreceiving device. However, when the multilayered film becomes too thick, strain occurs due to the stress on the film. As a result, there is a risk of the film separating or its properties deteriorating, causing increased current leakage or a reduced transmission rate. A multilayered film therefore should be formed into a thickness such that there is no such risk of its properties deteriorating and a second light-absorbing layer is established in the light path through which the light passing through the multilayered film reaches the first light-absorbing layer. This second light-absorbing layer has a band gap wavelength longer than the short wavelength light and shorter than the long wavelength light, and therefore the short wavelength light that is not reflected by the multilayered film can be absorbed by this layer. Meanwhile, the long wavelength light passes through this second light-absorbing layer and reaches the first light-absorbing layer.

Such a photoreceiving device can be caused to selectively intercept long wavelength light at the preferred intensity selection ratio by the actions of both the multilayered film and the second light-absorbing film that selectively absorbs short wavelength light. Accordingly, it is not necessary for either the multilayered film or the second light-absorbing layer to be thick. The risk of the strain of each layer is thereby eliminated and cost reductions for the photoreceiving device can be achieved.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

The embodiments of the present invention will be explained below with reference to the drawings. These drawings merely have the purpose of showing the forms, sizes, and positional relationships of various components in order that the invention be understood. Consequently, the present invention is in no way limited by these drawings.

First Embodiment

Figure 1:
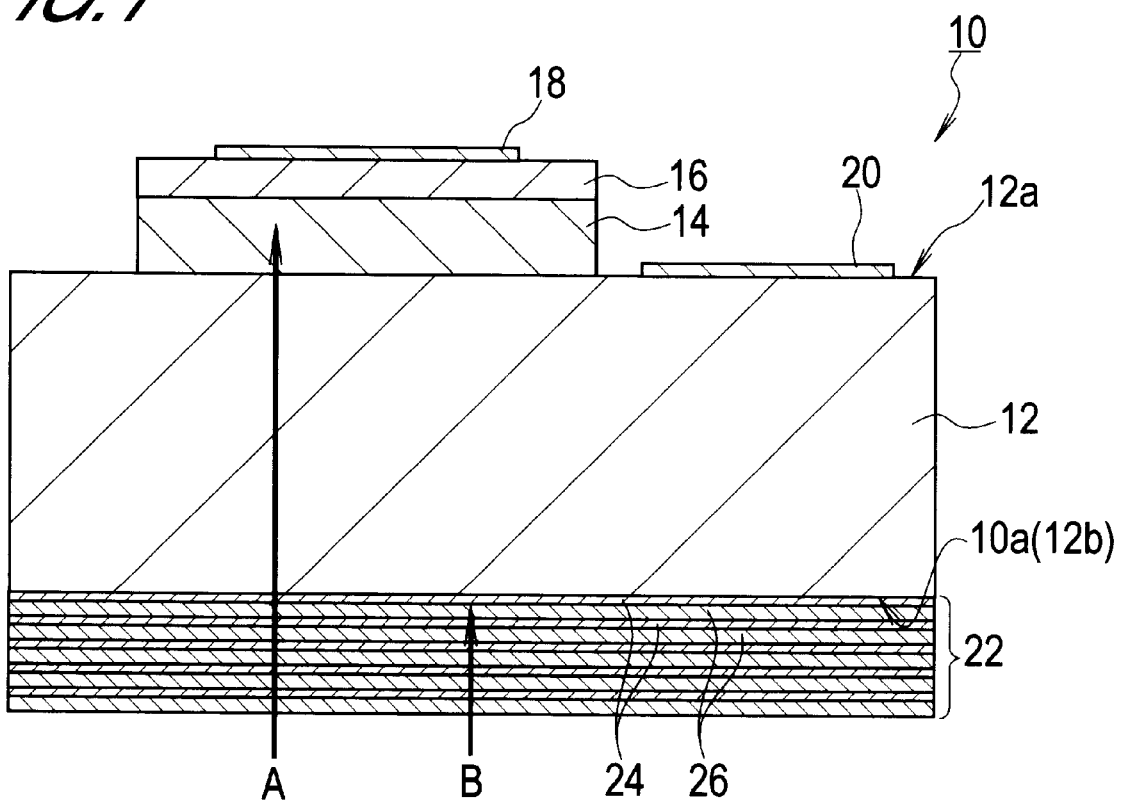
FIG. 1 is a cross sectional view showing the schematic constitution of the semiconductor photoreceiving device according to the first embodiment.

The constitution of the semiconductor photoreceiving device according to the first embodiment of the present invention will be explained below with reference to FIG. 1. FIG. 1 is a cross sectional view showing the schematic constitution of the semiconductor photoreceiving device.

The semiconductor photoreceiving device 10 is used in multiplexed optical communications including the long wavelength light A and short wavelength light B. This semiconductor photoreceiving device 10 selectively intercepts the long wavelength light A from the multiplexed light incident on (or entering or impinging on or arriving at) the photoreceiving surface 10a. This photoreceiving device 10 comprises, at least, a substrate 12 and a first light-absorbing layer 14 established on the first main surface 12a side of the substrate 12 and composed of a material having a band gap wavelength longer than the long wavelength light A.

In this example, multiplexed light comprises long wavelength light A with a wavelength of 1.55 μm and short wavelength light B with a wavelength of 1.3 μm. The photoreceiving device 10 comprises an n-type InP substrate 12 and an InGaAs layer, as the first light-absorbing layer 14, established on the upper surface, or first main surface 12a, of this n-type InP substrate 12. The InGaAs layer 14 has a band gap wavelength of 1.7 μm, and therefore absorbs both the 1.55 μm wavelength light A and the 1.3 μm wavelength light B. In this photoreceiving device 10, a p-type InP layer 16 is established as a contact layer on the upper surface of the InGaAs layer 14. A p-type electrode 18 is established on the upper surface of this p-type InP layer 16. Furthermore, an n-type electrode 20 is established in a region separate from the region where the InGaAs layer 14 is established on the first main surface 12a of the n-type InP substrate 12. The optical signal absorbed by the first light-absorbing layer (InGaAs layer) 14 undergoes opto-electric conversion and is extracted as an electrical signal from the p-type electrode 18 and n-type electrode 20 (FIG. 1).

In the example shown in FIG. 1, the photoreceiving device is a back surface incident type element. In other words, the photoreceiving surface 10a of the photoreceiving device 10 is the second main surface 12b (back surface) side of the substrate 12. A multilayered film 22, formed of stacked layers of materials with mutually different indexes of refraction laminated together, is established on the photoreceiving surface 10a. This multilayered film 22 is a multilayered film 22 wherein the thickness of each layer and the number of layers are designed so that the long wavelength light A is transmitted and short wavelength light B is refracted (FIG. 1).

In this example, the multilayered film 22 is a film comprising Si layers 24 with a high index of refraction (n=3.5) and SiO layers 26 with a low index of refraction (n=1.7 to 2.0), which are stacked alternately. Otherwise, the combination of materials comprising the multilayered film 22 may be selected from among combinations of cryolite (fluoride of Na and Al: $Na_3AlF_6$ (n=1.35)) and ZnS (n=2.3), $SiO_2$ (n=1.46) and $TiO_2$ (n=2.3), $Al_2O_3$ (n=1.7) and Si (n=3.5), $SiO_2$ and $Al_2O_3$, and $SiO_2$ and Si.

The thickness of each layer and the number of layers in the multilayered film 22 are determined on the basis of the conventional optical computation method for the multilayered film used in optical coatings, with consideration of the intensity selection ratio of the short wavelength light B to the long wavelength light A. The reflectance of the multilayered film is as disclosed in the Reference 5 (Yoshida, "Applied Physics and Optics Selection 3, Thin Films", Baifukan, 1997, pp. 173–174). Based on a method using the effective Fresnel coefficient in this Reference 5, a program is prepared to determine the thickness of each layer and the number of layers according to the desired reflectance. The necessary settings and conditions, such as the desired reflectance, the index of refraction of the materials constituting the layers, and the wavelengths used are added to this program and the thickness of each layer and the number of layers in the multilayered film are determined by calculations using a computer. Moreover, the abovementioned selection ratio in the multilayered film 22 is optimally within a range of −27 to −33 dB.

Due to the use of such a multilayered film 22, the 1.55 μm wavelength light A can be transmitted and the 1.3 μm wavelength light B can be reflected.

When multiplexed light composed of the 1.55 μm wavelength light A and the 1.3 μm wavelength light B enters the photoreceiving device 10 according to the present embodiment, the 1.3 μm wavelength light B is reflected and the 1.55 μm wavelength light A is transmitted by the multilayered film 22. Afterwards, the 1.55 μm wavelength light A that has passed through the n-type InP substrate 12 enters the InGaAs layer 14. The 1.55 μm wavelength light A is absorbed by this InGaAs layer 14, and undergoes optoelectric conversion and is extracted as an electrical signal from the p-type electrode 18 and the n-type electrode 20 (FIG. 1).

In this way, the semiconductor photoreceiving device according to the present invention allows the reception of only the long wavelength light A without cutting away the PLC waveguide and establishing an optical filter between the photoreceiving device and the incoming light.

Second Embodiment

Figure 2:
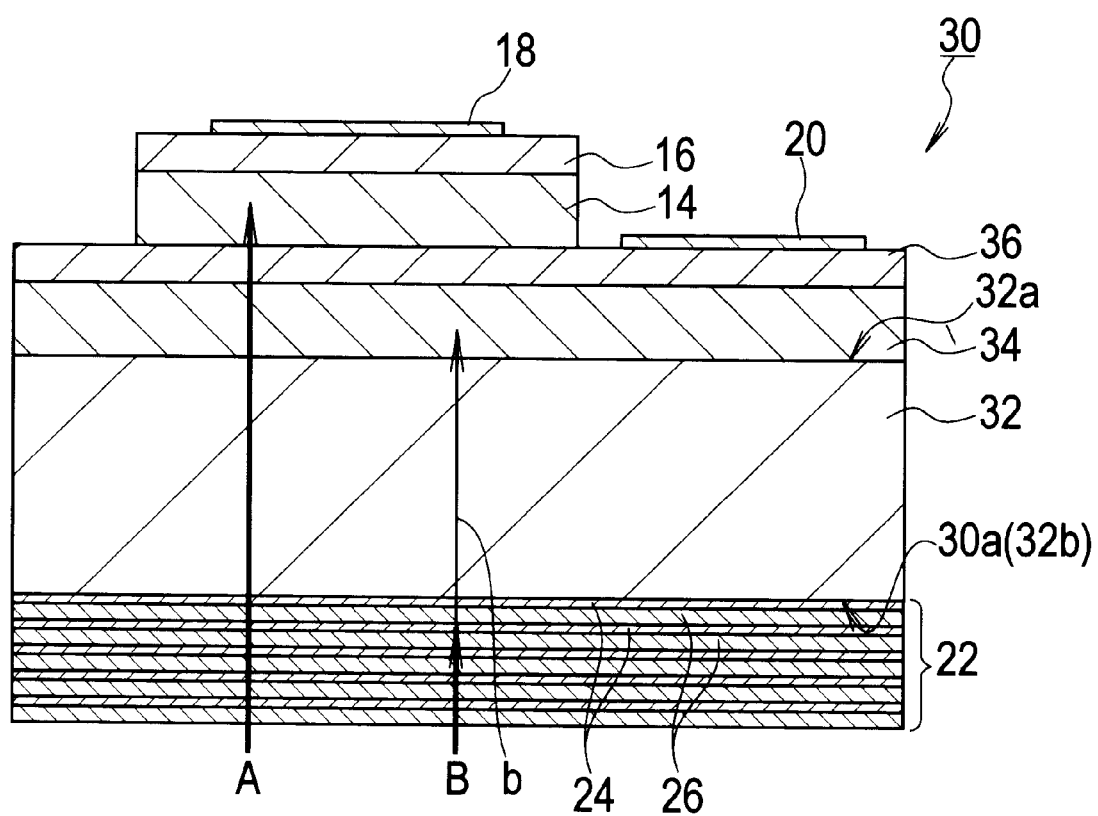
FIG. 2 is a cross sectional view showing the schematic constitution of the semiconductor photoreceiving device according to the second embodiment.

The constitution of the semiconductor photoreceiving device according to the second embodiment of the present invention will be explained next with reference to FIG. 2. FIG. 2 is a cross sectional view of the constitution of the semiconductor photoreceiving device according to the second embodiment.

Like the first embodiment, the semiconductor photoreceiving device 30 relating to the present embodiment is a photoreceiving device 30 used in multiplexed optical communications, using multiplexed light comprising 1.55 μm wavelength light as the long wavelength light A and 1.3 μm wavelength light as the short wavelength light B, and selectively intercepts the long wavelength light A. Like the first embodiment, the photoreceiving device comprises at least a substrate 32 and a first light-absorbing layer 14 established on the first main surface side 32a of the substrate 32. This first light-absorbing layer 14 is composed of a material having a band gap wavelength longer than the long wavelength light A. The photoreceiving surface 30a of this photoreceiving device 30 is the second main surface 32b of the substrate 32; the same type of multilayered film 22 as In the first embodiment is formed on that surface. In the present embodiment, in particular, a second light-absorbing layer 34 for selectively absorbing the short wavelength light B is established in the light path from the multilayered film 22 to the first light-absorbing layer 14.

For this reason, the photoreceiving device 30 in this example comprises an InP substrate 32 and further comprises an an InGaAsP layer as the second light-absorbing layer 34, an n-type InP layer 36 as a buffer layer, an InGaAs layer as the first light-absorbing layer 14, and a p-type InP layer 16 as the contact layer, which are established this order on the first main surface 32a of the InP substrate 32. As already explained, because the same type of multilayered film 22 as in the first embodiment is established on the second main surface 32b side of the InP substrate 32, the photoreceiving device 30 in this example is a back surface incidence type element. Also, a p-type electrode 18 is established on the upper surface of the p-type InP layer 16 and an n-type electrode 20 is established on the upper surface of the n-type InP layer 36 in a separate region from where the InGaAs layer 14 is established (FIG. 2).

In the photoreceiving device 30 with this type of constitution, the band gap wavelength of the InGaAsP layer 34 is 1.4 $\mu$m. As a result, the 1.55 $\mu$m wavelength light A is transmitted and the 1.3 $\mu$m wavelength light B is absorbed by this layer 34.

In the photoreceiving device 30 according to the present embodiment, the 1.3 $\mu$m wavelength light B is reflected to a certain extent by the multilayered film 22 and then the 1.3 $\mu$m wavelength light b that is transmitted without being reflected is absorbed by the second light-absorbing layer 34, that has the property of transmitting the 1.55 $\mu$m wavelength light A while absorbing the 1.3 $\mu$m wavelength light B. Accordingly, after the 1.3 $\mu$m wavelength light B and b are removed by the multilayered film 22 and the second light-absorbing layer 34, only the 1.55 $\mu$m wavelength light A is absorbed by the first light-absorbing layer 14.

In the present embodiment, the photoreceiving device 30 is designed to have a property that the intensity selection ratio of the 1.3 $\mu$m wavelength light B to the 1.55 $\mu$m wavelength light A becomes –27 to –33 dB, for example. In this example, the thickness of each layer and the number of layers constituting the multilayered film 22 are determined so that the abovementioned selection ratio becomes –20 dB in the multilayered film 22. The method for determining the thickness of each layer and the number of layers is the same as that explained in the first embodiment.

When multiplexed light composed of 1.55 $\mu$m wavelength light A and 1.3 $\mu$m wavelength light B enters this type of photoreceiving device 30, the 1.3 $\mu$m wavelength light B is reflected and the 1.55 $\mu$m wavelength light A is transmitted by this multilayered film 22. In this multilayered film 22, the selection ratio of the 1.55 $\mu$m wavelength light A to the 1.3 $\mu$m wavelength light B is about –20 dB, and therefore a small amount of 1.3 $\mu$m wavelength light b passes through the multilayered film 22. This 1.3 $\mu$m wavelength light b is called the residual light b. The light A and the light b that have passed through the multilayered film pass through the InP substrate 32 and reach the InGaAsP layer 34. The residual light b is absorbed by this InGaAsP layer 34 while only the 1.55 $\mu$m wavelength light A is transmitted. Afterwards, the 1.55 $\mu$m wavelength light A that has reached the InGaAs layer 14 is absorbed by this layer 14, undergoes opto-electric conversion, and is extracted as an electrical signal from the p-type electrode 18 and the n-type electrode 20.

As a result, in the present embodiment, the 1.55 $\mu$m wavelength light A can be selected at the preferred selection ratio and received by the actions of both the multilayered film 22 and the second light-absorbing layer 34. For this reason, in order to obtain a photoreceiving device having a selection ratio of about –30 dB, if only the multilayered film or only the second light-absorbing layer is established in the photoreceiving device, the thickness of these films (layers) must be as thick as strain is produced in the films or the properties are deteriorated. In this embodiment, however, this is not necessary. Consequently, a photoreceiving device that is inexpensive and has good properties can be obtained.

Figure 3:
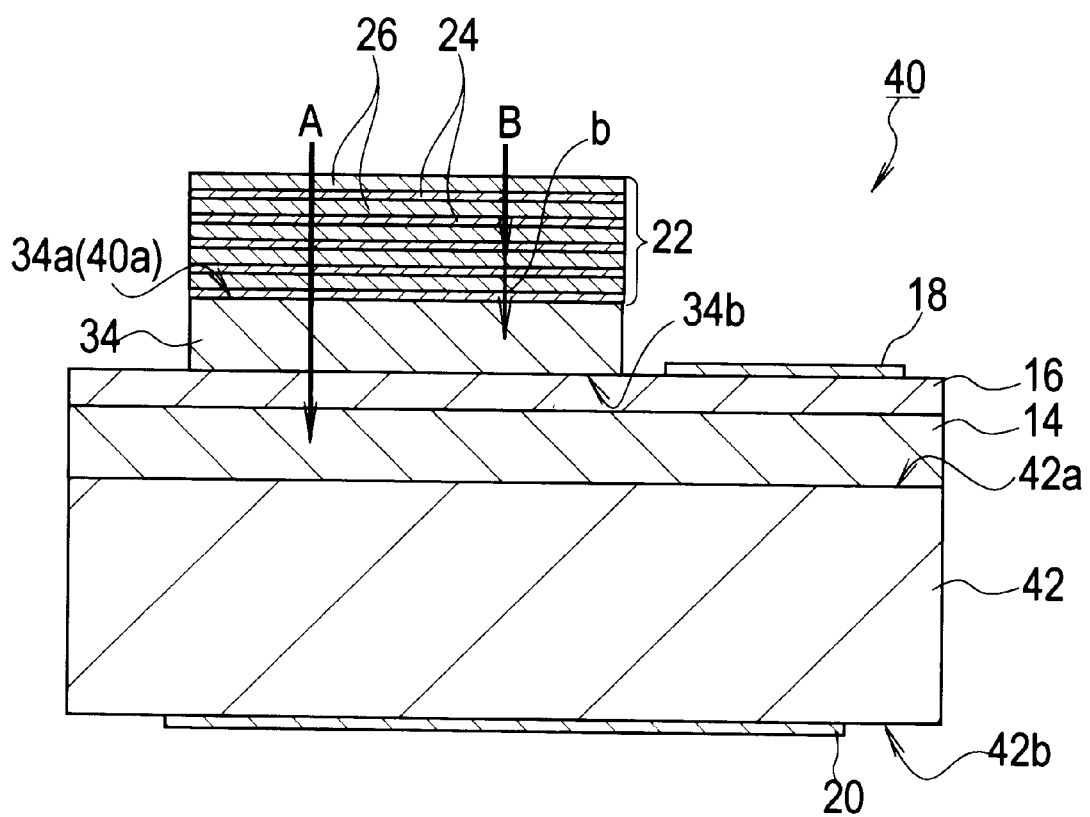
FIG. 3 is a cross sectional view showing the constitution of a first variation of the second embodiment.
Figure 4:
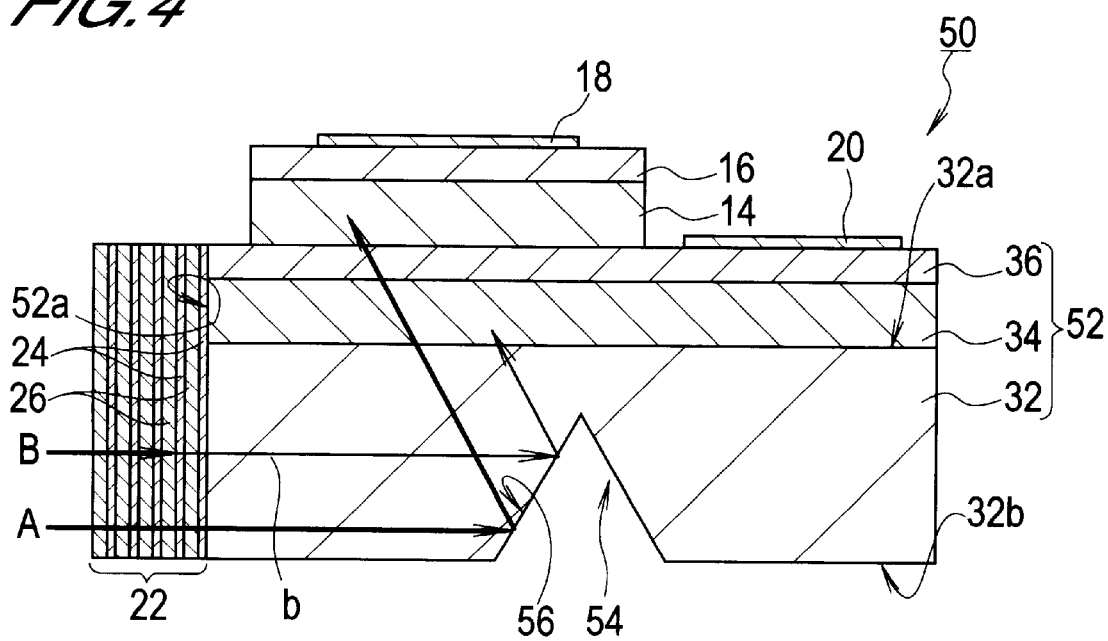
FIG. 4 is a cross sectional view showing the constitution of a second variation of the second embodiment.
Figure 5:
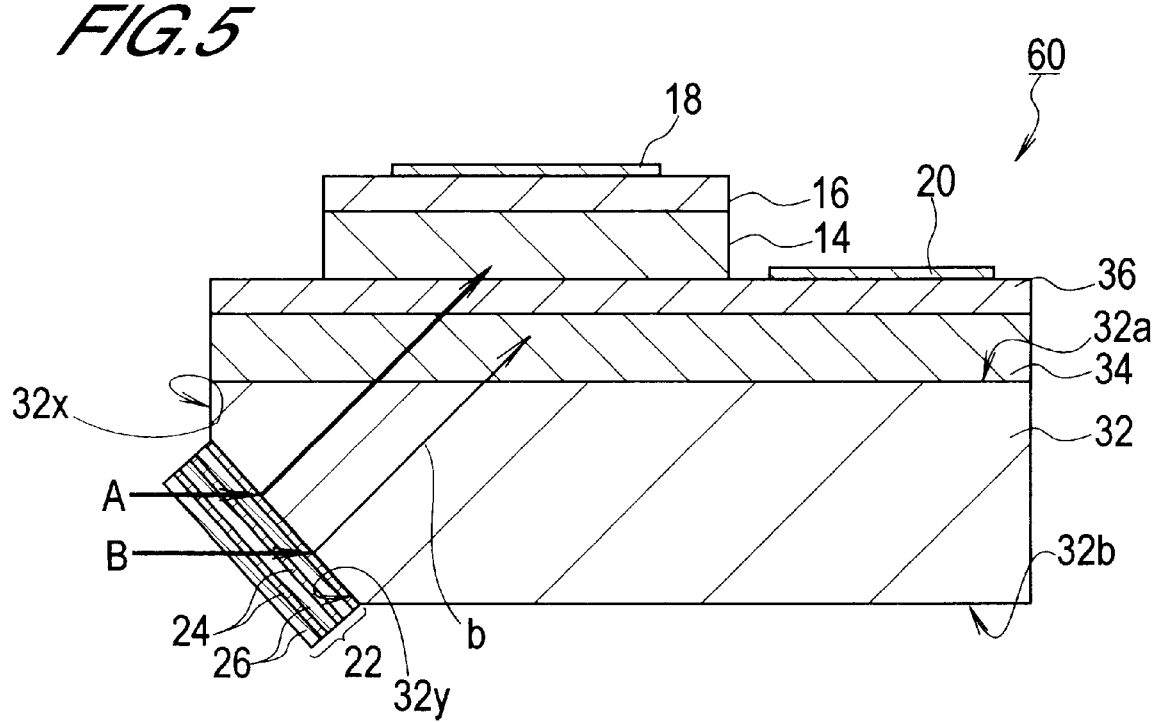
FIG. 5 is a cross sectional view showing the constitution of a third variation of the second embodiment.

FIGS. 3 through 5 show alternative examples of the constitution of the photoreceiving device according to the second embodiment.

FIG. 3 is an example of the constitution of the present invention applied to a top surface incidence type photoreceiving device 40. FIGS. 4 and 5 are examples of the constitution of the present invention applied to end surface incidence type photoreceiving devices 50 and 60. These figures all show cross sectional views of the constitution of the photoreceiving devices.

The photoreceiving device shown in FIG. 3 has the following layers established in this order on the first main surface 42a of the n-type InP substrate 42: an InGaAs layer that is the first light-absorbing layer 14, a p-type InP layer 16, an InGaAsP layer that is the second light-absorbing layer 34, and the multilayered film 22. An n-type electrode 20 is established on the second main surface 42b of the n-type InP substrate 42 and a p-type electrode 18 is established on the p-type InP layer 16 in a region separate from where the InGaAsP layer 34 is established (FIG. 3).

The photoreceiving surface 40a of this photoreceiving device 40 is the surface 34a that is opposite to the surface 34b on the substrate side of the InGaAsP layer 34.

The photoreceiving device 50 shown in FIG. 4 has the following layers established in this order on the first main surface 32a of the InP substrate 32: an InGaAsP layer that is the second light-absorbing layer 34, an n-type InP layer 36, an InGaAs layer that is the first light-absorbing layer 14, and a p-type InP layer 16. A p-type electrode 18 is established on the p-type InP layer 16 and an n-type electrode 20 is established on the n-type InP layer 36 in a region separate from where the InGaAs layer 14 is established. A multilayered film 22 is established on one end 52a of the laminated body 52 composed of the InP substrate 32, InGaAsP layer 34, and an n-type InP layer 36. Furthermore, a V-shaped groove 54 is formed in the second main surface 32b side of the InP substrate 32. This V-shaped groove 54 is designed such that the passage of light is directed to the second light-absorbing layer 34, by reflecting light with the mesa surface 56 of the groove 54 when light incident from the end surface 52a passes through the substrate 32. It is preferable that this V-shaped groove 54 be established so as to be parallel to the end surface 52a. This V-shaped groove is formed by etching the second main surface 32b side of the InP substrate 32.

The photoreceiving device 60 in FIG. 5 is also an end surface incidence type element. The constitution of the first main surface 32a of the InP substrate 32 is the same as the device 50 in FIG. 4. Specifically, the following are established in this order on the first main surface 32a of the InP substrate 32: an InGaAsP layer that is the second light-absorbing layer 34, an n-type InP layer 36, an InGaAs layer that is the first light-absorbing layer 14, and a p-type InP layer 16. A p-type electrode 18 is established on the p-type InP layer 16 and an n-type electrode 20 is established on the n-type InP layer 36 in a region separate from where the InGaAs layer 14 is established (FIG. 5). In this constitution, part of the corner, including the angle at which the second main surface 32b and end surface 32x of the InP substrate 32 intersect, is formed obliquely. This mesa surface 32y is an inclined surface with respect to the second main surface 32b and the end surface 32x, and the angle of this mesa surface 32y to the incoming light is determined such that the light incident on or entering the mesa surface 32y is refracted by this mesa surface 32y and the refracted light enters the second light-absorbing layer 34 without being entirely reflected. After the formation of the V-shaped groove by wet etching the second main surface 32b of the InP substrate 32, this mesa surface 32y is formed by cleavage, scribing, dicing, or etching near the peak of this V-shaped groove. Part of the surface of this V-shaped groove attained by cleavage or the like becomes the mesa surface 32y.

EXAMPLE

Figure 6:
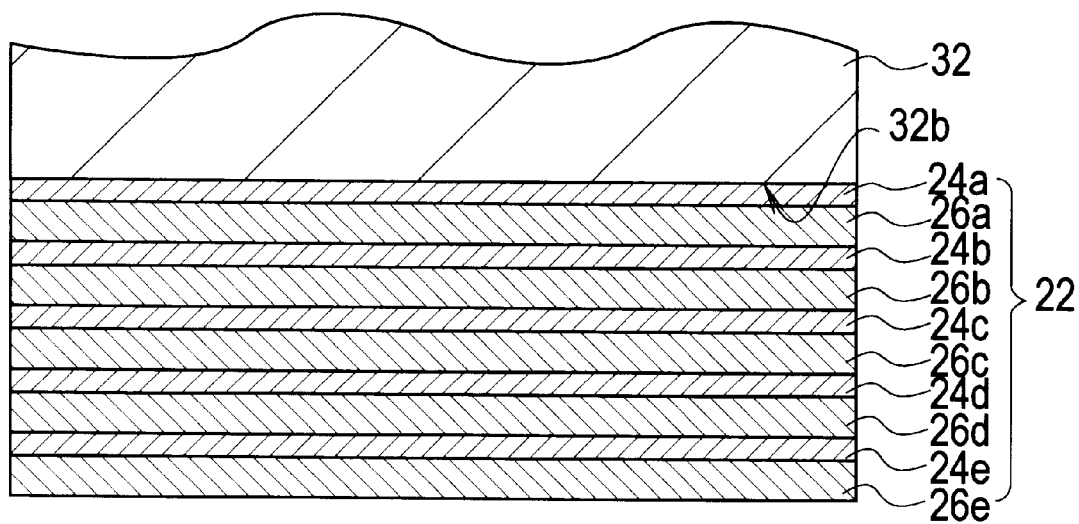
FIG. 6 is a schematic view showing the constitution of the multilayered film designed for the embodiments of the present invention.
Figure 7:
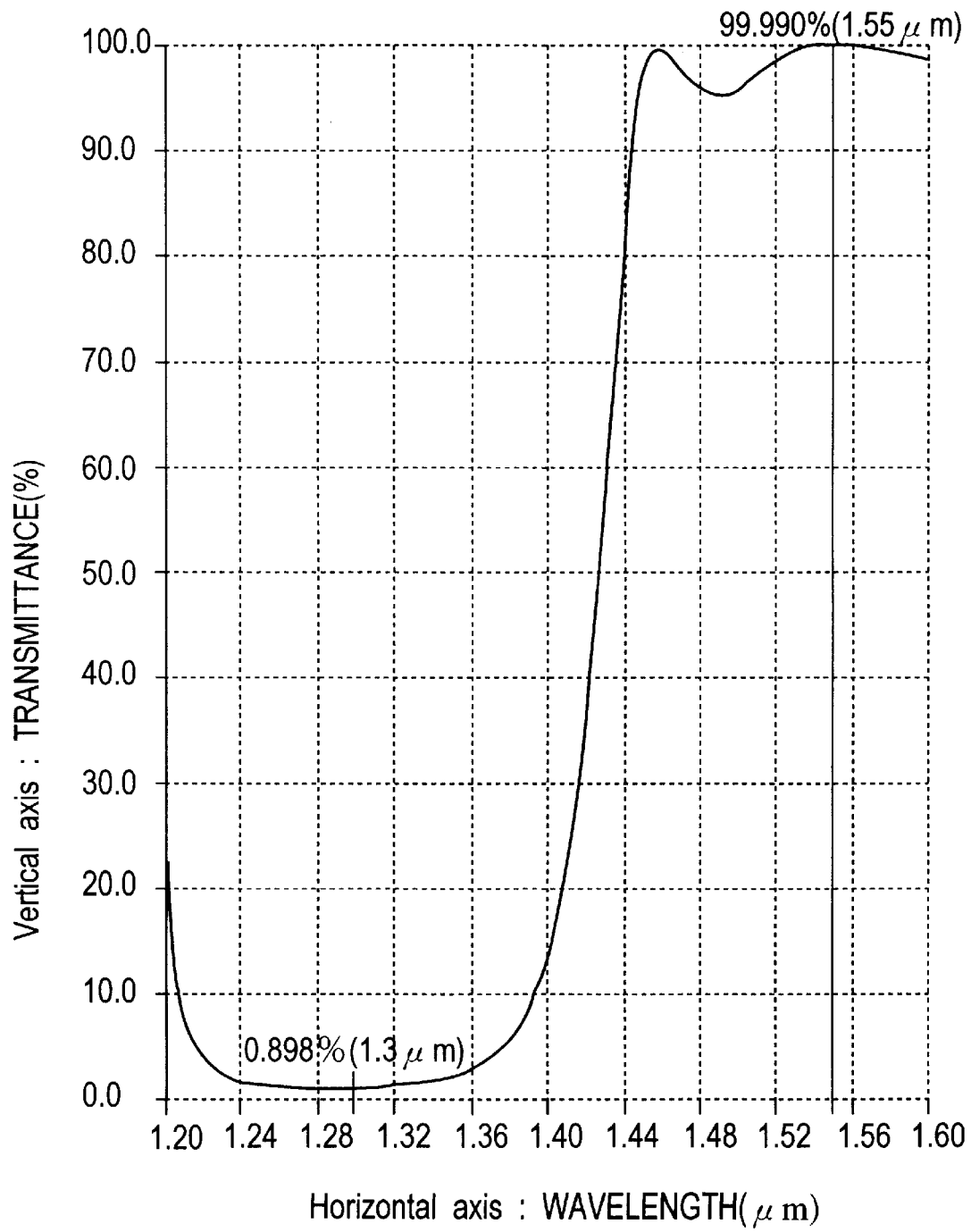
FIG. 7 shows the transmittance of the multilayered film according to the embodiments.

The semiconductor photoreceiving devices explained with the second embodiment and with reference to FIGS. 2, 6, and 7 are explained below with a more specific example. FIG. 2 shows the constitution of the semiconductor photoreceiving device, FIG. 6 shows the constitution of the multilayered film designed for this embodiment, and FIG. 7 shows the transmittance properties of the multilayered film in FIG. 6 in the 1.20 $\mu$m to 1.60 $\mu$m wavelength band.

The multilayered film 22 used in this photoreceiving device 30 comprises Si layers 24 and SiO layers 26 which are stacked alternately (see FIG. 2). The thickness of the layers and the number of layers are determined on the basis of the method explained above so that the selection ratio of the 1.3 $\mu$m wavelength light B to the 1.55 $\mu$m wavelength light A becomes about −20 dB.

As a result, the multilayered film 22 that was designed comprises 10 layers in the following order from the second main surface 32b side of the InP substrate 32: a first Si layer 24a with a thickness of 290.68 nm, a first SiO layer 26a with a thickness of 475.92 nm, a second Si layer 24b with a thickness of 82.64 nm, a second SiO layer 26b with a thickness of 521.98 nm, a third Si layer 24c with a thickness of 286.07 nm, a third SiO layer 26c with a thickness of 535.77 nm, a fourth Si layer 24d with a thickness of 280.45 nm, a fourth SiO layer 26d with a thickness of 174.58 nm, a fifth Si layer 24e with a thickness of 262.76 nm, and a fifth SiO layer 26e with a thickness of 323.50 nm (FIG. 6). The total thickness of this multilayered film 22 was 3.2 $\mu$m. Accordingly, the selection ratio of the 1.3 $\mu$m light B to the 1.55 $\mu$m light A became −20.47 dB.

FIG. 7 shows the spectral properties of the light passing through this multilayered film 22. According to FIG. 7, the transmittance of the multilayered film 22 for the 1.3 $\mu$m wavelength light B was 0.898% while the transmittance for the 1.55 $\mu$m wavelength light A was 99.990% (FIG. 7).

It is also desirable that the photoreceiving device 30 have the property that the selection ratio of the 1.3 $\mu$m wavelength light B to the 1.55 $\mu$m wavelength light A, when absorbed by the first light-absorbing layer 14, becomes −30 dB. For this reason, a second light-absorbing layer 34 of InGaAsP with a band gap wavelength of 1.4 $\mu$m is established (FIG. 2). Because the selection ratio of −20 dB is obtained in the multilayered film 22, the thickness of the InGaAsP layer 34 may be 2.6 $\mu$m in order that the selection ratio in the second light-absorbing layer 34 becomes −30 dB.

Consequently, in this example of the photoreceiving device 30, the thickness of the multilayered film 22 is 3.2 $\mu$m in all and the thickness of the InGaAsP layer 34 is 2.6 $\mu$m. In the case of attaining the −30 dB selection ratio with only the multilayered film 22 or only the second light-absorbing layer 34, the multilayered film or the second light-absorbing layer must be much thicker than the abovementioned thicknesses (3.2 $\mu$m or 2.6 $\mu$m). In this example, however, because the −30 dB selection ratio may be attained with the multilayered film 22 and the second light-absorbing layer 34 together, the thicknesses may be thinner than in the conventional case. With such thicknesses, there is no risk of creating strain due to film stress or of the properties deteriorating. Cost reductions are achieved because the InGaAsP layer 34, formed by epitaxial growth, may also be thin. Accordingly, a photoreceiving device that is inexpensive but has stable properties can be obtained.

In the case of using only the InGaAsP layer without the multilayered film in this example, the InGaAsP layer must have a thickness of 8.5 $\mu$m in order to achieve a −30 dB selection ratio of the 1.3 $\mu$m wavelength light to the 1.55 $\mu$m wavelength light. This 8.5 $\mu$m thickness will be a factor to increase the cost of the photoreceiving device and is also be a factor to cause film separation and deterioration of the properties because of the high film stress.

Also, 1.55 $\mu$m wavelength light was used as the long wavelength light and 1.3 $\mu$m wavelength light was used as the short wavelength light in the embodiments and example discussed above, but the light used in a semiconductor photoreceiving device according to the present invention is not limited to light of these wavelengths.

What is claimed is:

1. A semiconductor photoreceiving device for selectively receiving long wavelength light from multiplexed light including long wavelength light and short wavelength light, comprising:

a multilayered film comprising alternately stacked layers of materials having mutually different indexes of refraction, the thicknesses and number of which are designed so as to transmit said long wavelength light and reflect said short wavelength light; and a first light-absorbing layer composed of a material having a band gap wavelength longer than the wavelength of said long wavelength light;

wherein said multiplexed light enters said first light-absorbing layer through said multilayered film.

2. A semiconductor photoreceiving device according to claim 1, comprising a substrate having a first main surface and a second main surface;

wherein said first light-absorbing layer is established on the first main surface side of said substrate and said multilayered film is established on the second main surface side of said substrate.

3. A semiconductor photoreceiving device according to claim 1, comprising a substrate having a first main surface;

wherein said multilayered film is established on said first main surface side of said substrate with said first light-absorbing layer interposed therebetween.

4. A semiconductor photoreceiving device according to claim 1, comprising a substrate having a first main surface and a side surface;

wherein said first light-absorbing layer is established on said first main surface side of said substrate; said multilayered film is established on said side surface of said substrate; and a mesa surface is established on said substrate in order that light passing through said multilayered film be reflected towards said first light-absorbing layer.

5. A semiconductor photoreceiving device according to claim 1, comprising a substrate having a first main surface;

wherein said first light-absorbing layer is established on said first main surface side of said substrate; and said multilayered film is disposed so that light passing through said multilayered film is refracted and enters said first light-absorbing layer.

6. A semiconductor photoreceiving device according to claim 1, comprising a second light-absorbing layer for absorbing said short wavelength light from said multiplexed light; and having a structure such that light passing through said multilayered film enters said first light-absorbing layer through said second light-absorbing layer.

7. A semiconductor photoreceiving device according to claim 2, comprising a second light-absorbing layer for absorbing said short wavelength light from said multiplexed light; and having a structure such that light passing through said multilayered film enters said first light-absorbing layer through said second light-absorbing layer.

8. A semiconductor photoreceiving device according to claim 3, comprising a second light-absorbing layer for absorbing said short wavelength light from said multiplexed light; and having a structure such that light passing through said multilayered film enters said first light-absorbing layer through said second light-absorbing layer.

9. A semiconductor photoreceiving device according to claim 4, comprising a second light-absorbing layer for absorbing said short wavelength light from said multiplexed light; and having a structure such that light passing through said multilayered film enters said first light-absorbing layer through said second light-absorbing layer.

10. A semiconductor photoreceiving device according to claim 5, comprising a second light-absorbing layer for absorbing said short wavelength light from said multiplexed light; and having a structure such that light passing through said multilayered film enters said first light-absorbing layer through said second light-absorbing layer.

11. A semiconductor photoreceiving device according to claim 6, wherein said second light-absorbing layer comprises material having a band gap wavelength that is longer than the wavelength of said short wavelength light and shorter than the wavelength of said long wavelength light.

12. A semiconductor photoreceiving device according to claim 1, wherein said multilayered film is a composite layer composed of Si layers with a high index of refraction and SiO layers with a low index of refraction which are stacked alternately.

13. A semiconductor photoreceiving device according to claim 12, wherein the index of refraction of said Si layer is 3.5 and the index of refraction of said SiO layer is within a range of 1.7 to 2.0.

14. A semiconductor photoreceiving device according to claim 1, wherein the combination of materials constituting said multilayered film is a combination selected from among cryolite and ZnS, a combination of $SiO_2$ and $TiO_2$, a combination of $Al_2O_3$ and Si, a combination of $SiO_2$ and $Al_2O_3$, and a combination of $SiO_2$ and Si.

15. A semiconductor photoreceiving device, according to claim 1, wherein the intensity selection ratio of the short wavelength light to the long wavelength light of said multilayered film is a value within a range of −27 to −33.

16. A semiconductor photoreceiving device according to claim 1, wherein said multilayered film has the property of transmitting 1.55 $\mu$m wavelength light while reflecting 1.3 $\mu$m wavelength light.

17. A semiconductor photoreceiving device according to claim 1, wherein said first light-absorbing layer has the property of absorbing 1.55 $\mu$m wavelength light and 1.3 $\mu$m wavelength light.

18. A semiconductor photoreceiving device, according to claim 6, wherein said second light-absorbing layer has the property of transmitting 1.55 $\mu$m wavelength light while absorbing 1.3 $\mu$m wavelength light.

19. A semiconductor photoreceiving device, according to claim 4, wherein said mesa surface is an inclined surface attained by making an angled cut of the corner portion of the substrate where the second main surface and side surface of said substrate intersect.

20. A semiconductor photoreceiving device according to claim 4, wherein said mesa surface is a wall of a V-shaped groove formed in the second main surface of said substrate.

\* \* \* \* \*